United States Patent
Matsumoto (10) Patent No.: US 11,659,734 B2
(45) Date of Patent: May 23, 2023

(54) DISPLAY DEVICE

(71) Applicant: Japan Display Inc., Tokyo (JP)

(72) Inventor: Yuko Matsumoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/743,614

(22) Filed: May 13, 2022

(65) Prior Publication Data

US 2022/0271099 A1 Aug. 25, 2022

Related U.S. Application Data

(63) Continuation of application No. 16/993,400, filed on Aug. 14, 2020, now Pat. No. 11,362,160, which is a continuation of application No. PCT/JP2019/004585, filed on Feb. 8, 2019.

(30) Foreign Application Priority Data

Mar. 6, 2018 (JP) .............................. JP2018-039900

(51) Int. Cl.
*H01L 27/32* (2006.01)

(52) U.S. Cl.
CPC ........ *H01L 27/326* (2013.01); *H01L 27/3276* (2013.01)

(58) Field of Classification Search
CPC .......................... H01L 27/3276; H01L 27/326
See application file for complete search history.

(56) References Cited

U.S. PATENT DOCUMENTS

| | | | | |
|---|---|---|---|---|
| 10,170,534 B1* | 1/2019 | Kim | .................... | H01L 27/3223 |
| 2005/0218396 A1* | 10/2005 | Tsuchiya | ............. | H01L 27/3246 257/13 |
| 2015/0041782 A1* | 2/2015 | Chery | ................. | H01L 51/5271 257/40 |
| 2015/0289343 A1* | 10/2015 | Matsumoto | ......... | H01L 27/3276 445/24 |
| 2016/0218151 A1* | 7/2016 | Kwon | ................. | H01L 27/3276 |

* cited by examiner

*Primary Examiner* — Douglas M Menz
(74) *Attorney, Agent, or Firm* — Michael Best & Friedrich LLP (57) ABSTRACT

A display device according to an embodiment of the present invention includes: a base material including a display region having a plurality of pixels and a frame region; a lower electrode provided in each of the plurality of pixels; an organic material layer arranged on the lower electrode; an upper electrode arranged on the organic material layer and covering the display region; a conductor portion provided in the frame region and connected to the upper electrode; and a rib provided on the conductor portion, wherein the upper electrode is arranged on the conductor portion via the rib, a first contact portion where the upper electrode and the conductor portion contact each other is located in the frame region, the rib has a side surface located at an opposite side of the first contact portion from the display region, and an end portion of the upper electrode faces the side surface.

18 Claims, 6 Drawing Sheets

DISPLAY DEVICE

CROSS-REFERENCE TO RELATED APPLICATION

This application is a continuation of U.S. patent application Ser. No. 16/993,400, filed on Aug. 14, 2020, which, in turn, is a Bypass Continuation Application of International Application PCT/JP2019/004585 having the International Filing Date of Feb. 8, 2019, and having the benefit of the earlier filing date of Japanese Application No. 2018-039900, filed on Mar. 6, 2018. Each of the identified applications is fully incorporated herein by reference.

BACKGROUND OF THE INVENTION

1. Field of the Invention

One or more embodiments of the present invention relate to an organic EL display device.

2. Description of the Related Art

In recent years, an image display device (hereinafter, referred to as an "organic electro-luminescent (EL) display device") using a self-luminous body called an organic light emitting diode (OLED) has been put into practical use. The organic EL display device uses a self-luminous body, for example, as compared with a liquid crystal display device, and thus is not only excellent in visibility and response speed, but also does not require a lighting device such as a backlight. Therefore, it is possible to reduce the thickness.

The organic EL display device includes a display panel in which a thin film transistor (TFT), an organic light emitting diode (OLED), and the like are formed on a base material. In such an organic EL display device, in order to protect a light emitting element from moisture and the like, a method of sealing a display region including the light emitting element has been adopted, for example, as disclosed in JP 2016-46215 A.

However, if there is a defect in the sealing region, for example, moisture may reach the light emitting element and cause a light emission failure (for example, a dark spot failure).

SUMMARY OF THE INVENTION

One or more embodiments of the present invention have been made in view of the above, an object thereof is to provide an organic EL display device capable of reliably preventing the occurrence of defective light emission.

An organic EL display device according to an embodiment of the present invention includes: a base material including a display region having a plurality of pixels and a frame region adjacent to the display region; a lower electrode provided in each of the plurality of pixels; an organic material layer arranged on the lower electrode; an upper electrode arranged on the organic material layer and covering the display region; a conductor portion provided in the frame region and connected to the upper electrode; and a rib provided on the conductor portion, wherein a part of the upper electrode is arranged above the conductor portion via the rib, a first contact portion where the upper electrode and the conductor portion contact each other is located in the frame region, the rib has a side surface located at an opposite side of the first contact portion from the display region, and an end portion of the upper electrode faces the side surface.

DETAILED DESCRIPTION OF THE INVENTION

Hereinafter, embodiments of the present invention will be described with reference to the drawings. It should be noted that the disclosure is merely an example, and those skilled in the art will understand that the appropriate modifications that can be easily conceived while keeping the gist of the invention are naturally included in the scope of the invention. In order to make the description clearer, the drawings may be schematically evaluated in terms of the width, thickness, shape, and the like of each unit as compared with the actual ones, but they are merely examples and are not intended to limit the interpretation of the present invention. In the present specification and each drawing, the same elements as those described previously with reference to the already-existing drawings are denoted by the same reference numerals, and the detailed description thereof may be appropriately omitted.

In the detailed description of the present invention, when defining the positional relationship between a certain component and another component, the terms "above" and "below" include not only the case where located directly above or below the certain component, but also the case where other components are further interposed therebetween unless otherwise specified.

Figure 1:
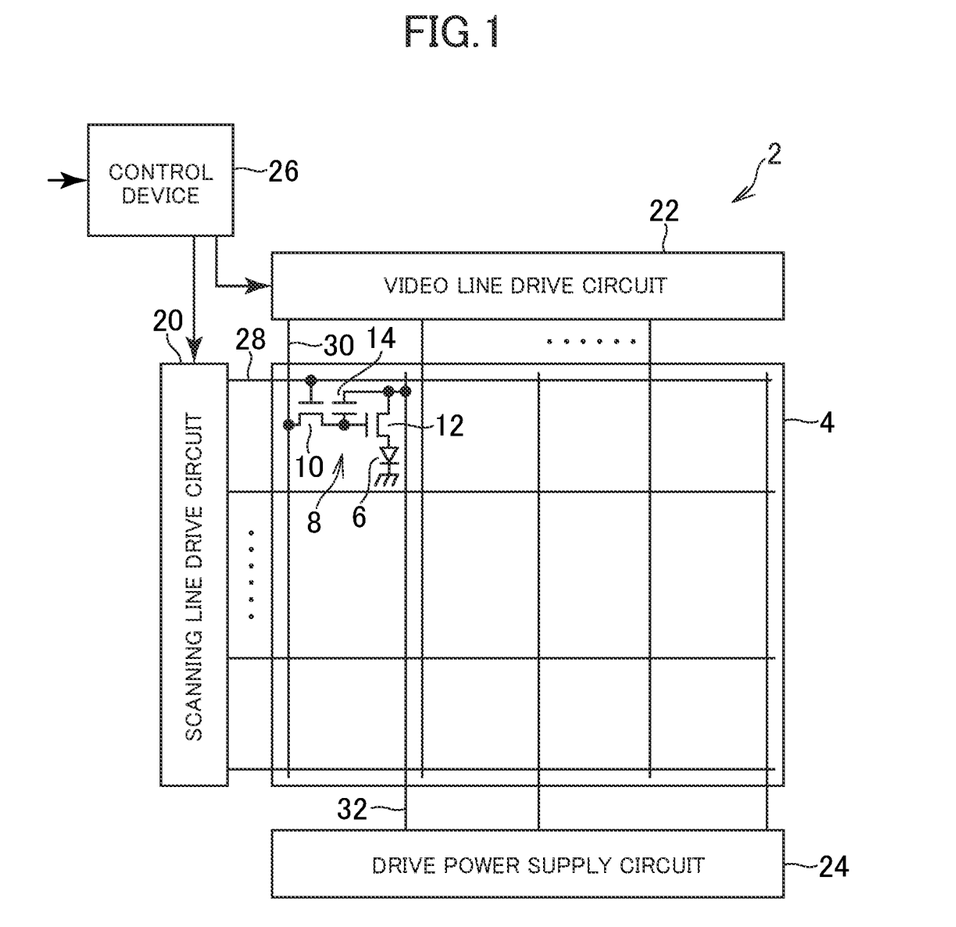
FIG. 1 is a schematic diagram showing a schematic configuration of an organic EL display device according to one embodiment of the present invention.

FIG. 1 is a schematic diagram showing a schematic configuration of a display device according to one embodiment of the present invention, taking an organic EL display device as an example. An organic EL display device 2 includes a pixel array unit 4 that displays an image and a drive unit that drives the pixel array unit 4. The organic EL display device 2 is configured by forming a stacked structure such as a thin film transistor (TFT) or an organic light emitting diode (OLED) on a base material. The schematic diagram shown in FIG. 1 is an example and the present embodiment is not limited thereto.

In the pixel array unit 4, OLEDs 6 and pixel circuits 8 are arranged in a matrix corresponding to the pixels. The pixel circuit 8 is configured of a plurality of TFTs 10 and 12 and a capacitor 14.

The drive unit includes a scanning line drive circuit 20, a video line drive circuit 22, a drive power supply circuit 24, and a control device 26, and drives the pixel circuit 8 to control the light emission of the OLED 6.

The scanning line drive circuit 20 is connected to a scanning signal line 28 provided for each horizontal alignment (pixel row) of pixels. The scanning line drive circuit 20 sequentially selects the scanning signal lines 28 according to a timing signal input from the control device 26 and applies a voltage for turning on a lighting TFT 10 to the selected scanning signal lines 28.

The video line drive circuit 22 is connected to a video signal line 30 provided for each vertical alignment (pixel column) of pixels. The video line drive circuit 22 receives a video signal from the control device 26 and outputs a voltage corresponding to the video signal of the selected pixel row to each video signal line 30 according to the selection of the scanning signal line 28 by the scanning line drive circuit 20. The voltage is written in the capacitor 14 via the lighting TFT 10 in the selected pixel row. A drive TFT 12 supplies the OLED 6 with a current corresponding to the written voltage, whereby the OLED 6 of the pixel corresponding to the selected scanning signal line 28 emits light.

The drive power supply circuit 24 is connected to a drive power supply line 32 provided for each pixel column and supplies a current to the OLED 6 via the drive power supply line 32 and the drive TFT 12 of the selected pixel row.

Here, a lower electrode of the OLED 6 is connected to the drive TFT 12. On the other hand, an upper electrode of each OLED 6 is an electrode common to the OLEDs 6 of all pixels. When the lower electrode is configured as an anode, a high potential is input, and the upper electrode serves as a cathode in which a low potential is input thereto. When the lower electrode is configured as a cathode, a low potential is input, and the upper electrode serves as an anode in which a high potential is input.

Figure 2:
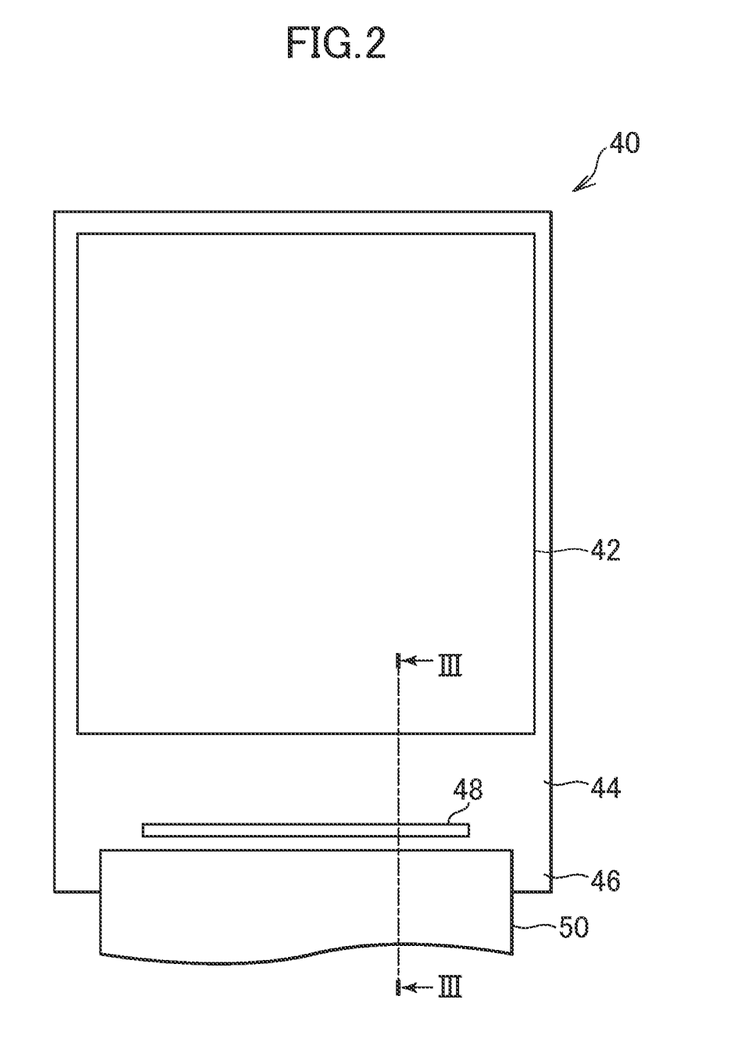
FIG. 2 is a schematic plan view showing an example of a display panel of the organic EL display device shown in FIG. 1.

FIG. 2 is a schematic plan view showing an example of a display panel of the organic EL display device shown in FIG. 1. A display region 42 of a display panel 40 is provided with the pixel array unit 4 shown in FIG. 1, and the OLEDs 6 are arranged in the pixel array unit 4 as described above. As described above, the upper electrode forming the OLED 6 is formed commonly to each pixel and covers the entire display region 42.

On one side of the rectangular display panel 40, a component mounting region 46 is provided and wirings connected to the display region 42 are arranged. In the component mounting region 46, a driver IC 48 that constitutes a drive unit is mounted or a flexible printed circuit board (FPC) 50 is connected. The FPC 50 is connected to the control device 26 and other circuits 20, 22, 24, and the like, or has an IC mounted thereon.

Figure 3:
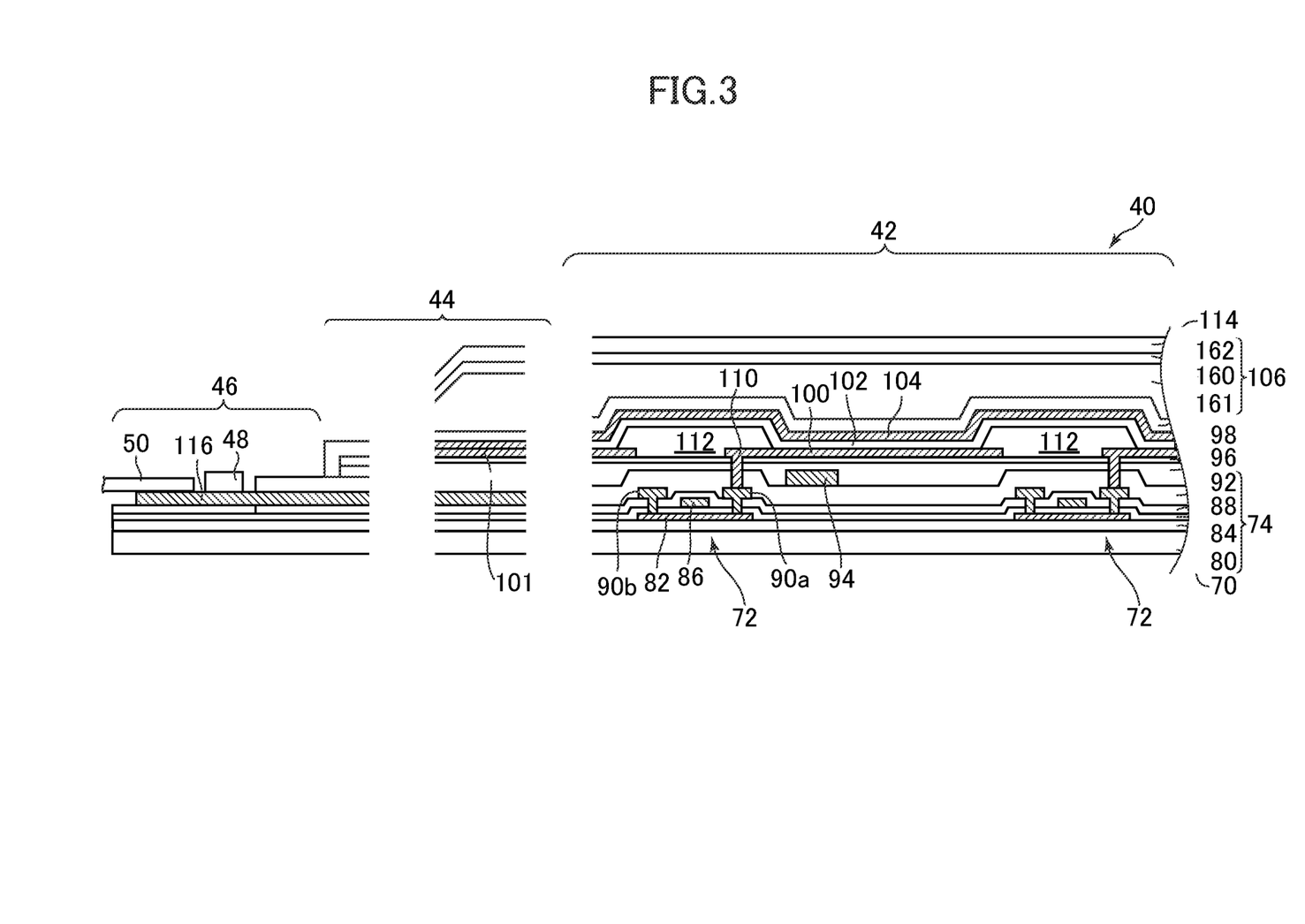
FIG. 3 is a schematic diagram showing an example of a cross section taken along line III-III in FIG. 2.

FIG. 3 is a schematic diagram showing an example of a cross section taken along line III-III in FIG. 2. The display panel 40 has, for example, a structure in which a circuit layer 74 having a TFT 72 and the like formed thereon, the OLED 6, and a sealing layer 106 for sealing the OLED 6 are stacked on a flexible base material 70. The flexible base material 70 is formed of, for example, a resin film including a resin such as a polyimide resin. Here, the base material 70 is formed by, for example, applying a resin material to form a film. For example, a protective film 114 is stacked on the sealing layer 106. Specifically, a sheet-shaped or film-shaped protective film 114 is attached to the sealing layer 106 with an adhesion layer interposed therebetween. In the present embodiment, the pixel array unit 4 is of a top emission type, and the light generated by the OLED 6 is emitted to the side opposite to the base material 70 side (upward in FIG. 3). When the colorization method in the organic EL display device 2 is the color filter method, for example, a color filter is arranged between the sealing layer 106 and the protective film 114 or on a counter substrate (not shown) side. For example, red (R), green (G), and blue (B) light is produced by passing white light generated by the OLED 6 through the color filter.

The pixel circuit 8, the scanning signal line 28, the video signal line 30, the drive power supply line 32, and the like described above are formed on the circuit layer 74 of the display region 42. At least a portion of the drive unit can be formed on the base material 70 as the circuit layer 74 in a region adjacent to the display region 42. As described above, the driver IC 48 that constitutes the drive unit and the FPC 50 can be connected to a wiring 116 of the circuit layer 74 in the component mounting region 46.

As shown in FIG. 3, a base layer 80 formed of an inorganic insulating material is arranged on the base material 70. As the inorganic insulating material, for example, silicon nitride (SiNy), silicon oxide (SiOx), and a complex thereof are used.

In the display region 42, a semiconductor region 82 serving as a channel portion and a source/drain portion of the top gate type TFT 72 is formed on the base material 70 via the base layer 80. The semiconductor region 82 is formed of, for example, polysilicon (p-Si). The semiconductor region 82 is formed, for example, by providing a semiconductor layer (p-Si film) on the base material 70, patterning this semiconductor layer, and selectively leaving a portion used for the circuit layer 74.

A gate electrode 86 is arranged on the channel portion of the TFT 72 with a gate insulating film 84 interposed therebetween. The gate insulating film 84 is typically formed of TEOS. The gate electrode 86 is formed, for example, by patterning a metal film formed by sputtering or the like. An interlayer insulating layer 88 is arranged on the gate electrode 86 to cover the gate electrode 86. The interlayer insulating layer 88 is formed of, for example, the above-mentioned inorganic insulating material. An impurity is introduced by ion implantation into the semiconductor region 82 (p-Si) serving as the source/drain portion of the TFT 72, and a source electrode 90a and a drain electrode 90b that are electrically connected to the source/drain portion are formed to form the TFT 72.

An interlayer insulating film 92 is arranged on the TFT 72. A wiring 94 is arranged on the surface of the interlayer insulating film 92. The wiring 94 is formed, for example, by patterning a metal film formed by sputtering or the like. With the metal film forming the wiring 94 and the metal film used for forming the gate electrode 86, the source electrode 90a, and the drain electrode 90b, for example, the wiring 116 and the scanning signal line 28, the video signal line 30, and the drive power supply line 32 shown in FIG. 1 can be formed to have a multilayer wiring structure. A planarizing film 96 and a passivation film 98 are formed thereon, and the OLED 6 is formed on the passivation film 98 in the display region 42. The planarizing film 96 is formed of, for example, a resin material. The passivation film 98 is formed of, for example, an inorganic insulating material such as SiNy.

The OLED 6 includes a lower electrode 100, an organic material layer 102, and an upper electrode 104. The OLED 6 is typically formed by stacking the lower electrode 100, the organic material layer 102, and the upper electrode 104 in this order from the base material 70 side. In the present embodiment, the lower electrode 100 is the anode (anode electrode) of the OLED 6 and the upper electrode 104 is the cathode (cathode electrode).

If the TFT 72 shown in FIG. 3 is the drive TFT 12 having an n-channel, the lower electrode 100 is connected to the source electrode 90a of the TFT 72. Specifically, after forming the above-described planarizing film 96, a contact hole 110 for connecting the lower electrode 100 to the TFT 72 is formed. For example, by patterning a conductor portion formed on the surface of the planarizing film 96 and in the contact hole 110, the lower electrode 100 connected to the TFT 72 is formed for each pixel. The lower electrode 100 is formed of, for example, a transparent metal oxide such as an In-based oxide (for example, indium tin oxide (ITO), indium zinc oxide (IZO), indium tin zinc oxide (ITZO)), or a metal such as Ag and Al.

A bank 112 for separating pixels is arranged on the above-described structure. For example, after forming the lower electrode 100, the bank 112 is formed at the pixel boundary, and the organic material layer 102 and the upper electrode 104 are stacked in the valid region of the pixel surrounded by the bank 112 (the region where the lower electrode 100 is exposed). The organic material layer 102 is typically formed by stacking a hole transport layer, a light emitting layer, and an electron transport layer in this order from the anode electrode side. The organic material layer 102 can have other layers. Examples of the other layers include a hole injection layer and an electron blocking layer arranged between the anode electrode and the light emitting layer, and an electron injection layer and a hole blocking layer arranged between the cathode electrode and the light emitting layer. The upper electrode 104 is configured of a transparent conductive film. The transparent conductive film is formed of, for example, a metal (for example, an ultrathin alloy of Mg and Ag) or a transparent metal oxide such as ITO, IZO, or ITZO.

The sealing layer 106 is arranged on the upper electrode 104 to cover the entire display region 42 (upper electrode 104). The sealing layer 106 has a stacked structure including a first sealing film 161, a sealing planarization film 160, and a second sealing film 162 in this order. The first sealing film 161 and the second sealing film 162 are formed of an inorganic material (for example, an inorganic insulating material). Specifically, the first sealing film 161 and the second sealing film 162 are formed by forming a SiNy film by a chemical vapor deposition (CVD) method. The sealing planarization film 160 is formed using an organic material (for example, a resin material such as a curable resin composition). On the other hand, in the component mounting region 46, the sealing layer 106 is not arranged.

For example, to secure the mechanical strength of the surface of the display panel 40, the protective film 114 is stacked on the surface of the display region 42. On the other hand, the protective film 114 is not provided in the component mounting region 46 to easily connect the IC and FPC.

A cathode contact portion is formed in a frame region 44 adjacent to the display region 42. In the illustrated example, a conductor portion 101 is formed in the same layer as the anode electrode 100, the cathode electrode 104 is connected to the conductor portion 101, and the conductor portion 101 can function as a cathode voltage supply wiring. That is, the conductor portion 101 and the cathode electrode 104 are electrically connected at the cathode contact portion. In one embodiment, the conductor portion 101 is formed in the display region 42 using the same material as the material forming the anode electrode 100 when forming the anode electrode 100. For example, the conductor portion 101 is formed of a material that is preferably used to secure the hole injection efficiency in the anode electrode 100. Specifically, the conductor portion 101 is formed of an In-based oxide such as ITO, IZO, and ITZO.

Figure 4A:
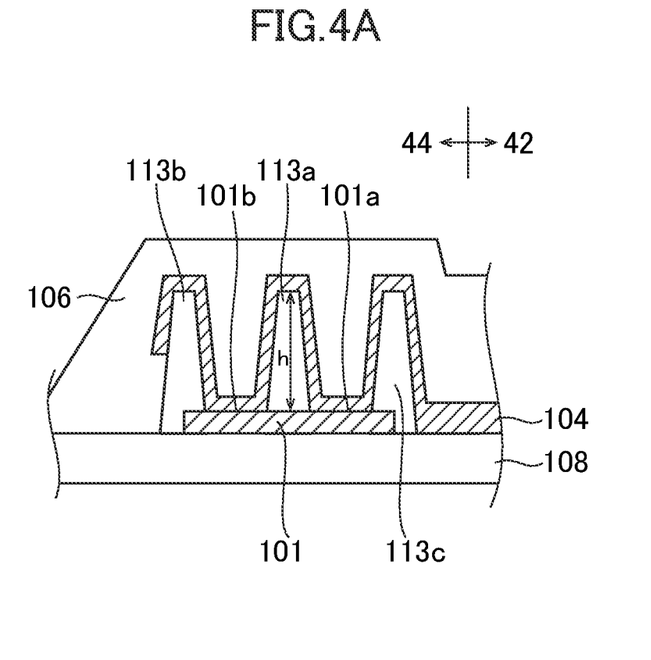
FIG. 4A is an enlarged cross-sectional view showing an example of a cathode contact portion of the display panel shown in FIG. 3.
Figure 4B:
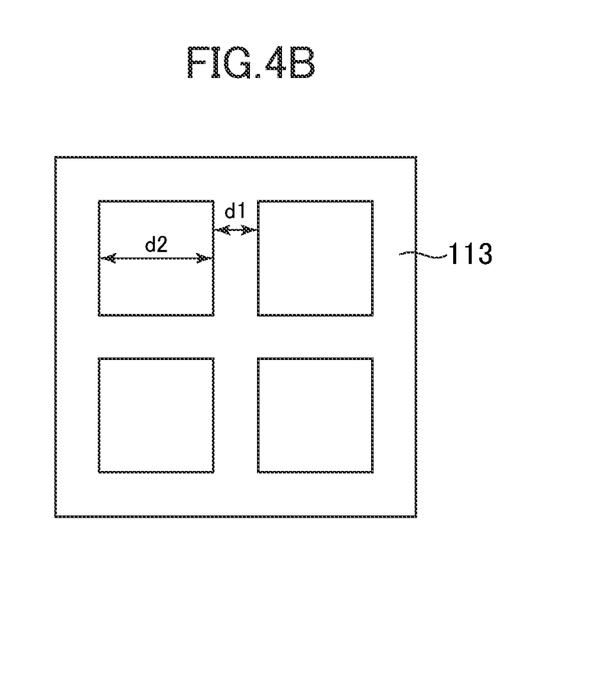
FIG. 4B is a diagram showing an example of a part of a plan-view shape of a rib shown in FIG. 4A.

FIG. 4A is an enlarged cross-sectional view showing an example of the cathode contact portion of the display panel shown in FIG. 3, and FIG. 4B is a diagram showing an example of a part of a plan-view shape of a rib shown in FIG. 4A. In FIG. 4A, the structure arranged below the anode electrode 100 shown in FIG. 3 is simplified and shown as a lower structure layer 108, and the protective film 114 is omitted.

As shown in FIG. 4A, a rib 113 is provided on the conductor portion 101 formed in the same layer as the anode electrode 100, and the cathode electrode 104 is arranged on the conductor portion 101 via the rib 113. As shown in FIG. 4B, the ribs 113 are formed in a grid pattern in a plan view such that the protrusions extending in a first direction and the protrusions extending in a second direction intersect each other. Then, in the portion where the rib 113 is not formed, the conductor portion 101 and the cathode electrode 104 are connected. From the viewpoint of improving the adhesiveness of the cathode contact portion, which will be described later, it is preferable that contact portions 101a and 101b between the conductor portion 101 and the cathode electrode 104 are surrounded by the ribs 113 as shown in the drawing (for example, surrounded from three or more directions) to subdivide the cathode contact portion. As is clear from the description of FIGS. 4A and 4B, the contact portions 101a and 101b can be said to be regions between the plurality of protrusions.

The rib 113 is formed using, for example, an organic material (for example, a resin material such as a photosensitive resin composition). In one embodiment, the rib 113 is formed when forming the bank 112 in the display region 42.

As shown in FIG. 4A, on the conductor portion 101, in order from the display region 42 side, the first contact portion 101a where the cathode electrode 104 and the conductor portion 101 contact, a first rib 113a, the second contact portion 101b where the cathode electrode 104 and the conductor portion 101 contact, and a second rib 113b are formed, and an end portion of the cathode electrode 104 reaches the side surface of the second rib 113b opposite to the display region 42.

The inorganic material forming the conductor portion 101 tends to have low adhesiveness to other inorganic films having different compositions (for example, a metal film, a metal oxide film, an inorganic insulating material film). For example, when the conductor portion 101 is formed of an In-based oxide and the cathode electrode 104 is formed of a metal (for example, an alloy of Mg and Ag) from the viewpoints of ensuring the electron injection efficiency and improving the light emission efficiency, peeling and floating tend to occur at the interface between the conductor portion 101 and the cathode electrode 104.

The rib 113 formed of a material (for example, an organic material) having higher adhesiveness than an inorganic film is provided on the conductor portion 101, and the end portion of the cathode electrode 104 crosses over the rib 113 to reach at least the side surface of the rib 113 opposite to the display region 42. Therefore, the adhesiveness at the cathode contact portion can be significantly improved. As such, peeling and floating that occur at the interface between the conductor portion 101 and the cathode electrode 104 are reduced, and problems caused by this peeling and floating can be prevented. Specifically, it is possible to prevent defects such as distortion from occurring in the sealing layer 106 arranged on the cathode electrode 104, and prevent defective light emission caused by moisture penetrating from the defects in the sealing layer 106.

From the viewpoint of effectively reducing the peeling and floating, in the illustrated example, the end portion of the cathode electrode 104 crosses over one or more ribs 113 (first ribs 113a) and reaches the second ribs 113b to form the second contact portion 101b on the side of the first contact portion 101a opposite to the display region 42.

The ribs 113b and 113c arranged at end portions of the conductor portion 101 are formed to cover the end portion of the conductor portion 101 from the upper surface to the side surface. Since the end portion of the conductor portion 101 tends to cause a problem due to the peeling and floating, the end portion of the conductor portion 101 does not come into contact with the cathode electrode 104. As shown in the drawing, it is preferable that the end portion of the conductor portion 101 does not contact the sealing layer 106. This is because it is possible to reduce the peeling and floating between the conductor portion 101 having low adhesiveness to the inorganic film and the sealing layer 106 (first sealing film 161).

The width (d1) of the rib 113 is, for example, 3 μm to 10 μm. The height (h) of the rib 113 is, for example, 1 μm to 3 μm. The distance (d2) between the ribs 113 depends on the size of the cathode contact portion and the like, but is preferably 250 μm or less, and more preferably 200 μm or less, from the viewpoint of effectively reducing the peeling and floating. On the other hand, from the viewpoint of lowering the resistance value of the cathode electrode 104 and preventing a decrease in brightness due to a voltage drop, for example, the contact area between the conductor portion 101 and the cathode electrode 104 is preferably 80% or more of the sum of the contact area between the conductor portion 101 and the cathode electrode 104 and the contact area between the conductor portion 101 and the rib 113. For example, the distance (d2) between the ribs 113 is preferably 100 μm or more. The distance between the ribs 113 may correspond to the width of the contact portion between the cathode electrode 104 and the conductor portion 101.

Figure 5:
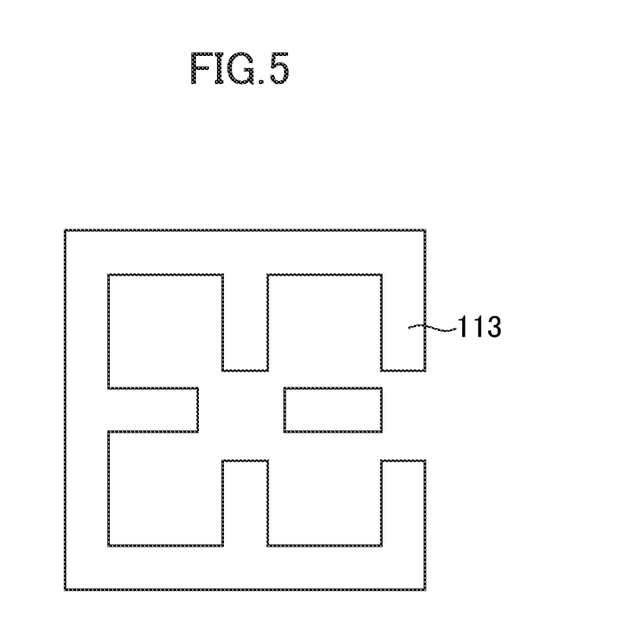
FIG. 5 is a diagram showing Modification 1 of a part of the plan-view shape of the rib provided in the cathode contact portion of the display panel shown in FIG. 3.
Figure 6:
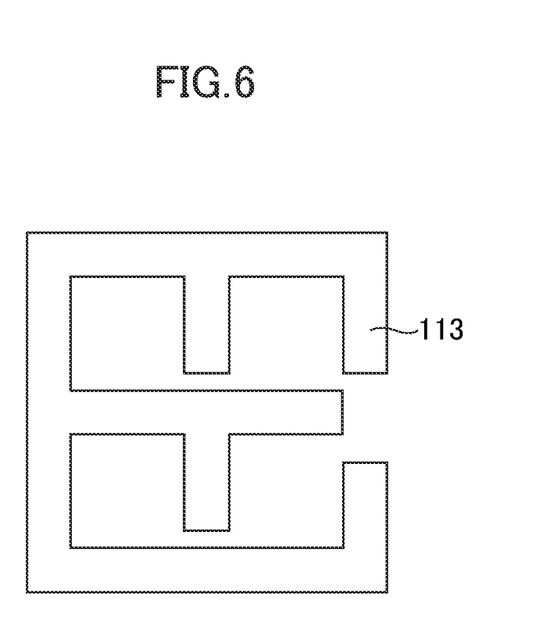
FIG. 6 is a diagram showing Modification 2 of a part of the plan-view shape of the rib provided in the cathode contact portion of the display panel shown in FIG. 3.

FIG. 5 is a diagram showing Modification 1 of a part of the plan-view shape of the rib provided in the cathode contact portion of the display panel shown in FIG. 3, and FIG. 6 is a diagram showing Modification 2 of a part of the plan-view shape of the rib provided in the cathode contact portion of the display panel shown in FIG. 3. For example, from the viewpoint of reducing the resistance of the cathode electrode 104, the present modifications are different from the above-described embodiment in that a portion in which the protrusion extending in the first direction does not intersect with the protrusion extending in the second direction is formed. The plan-view shape of the rib may have a structure in which the protrusions extending in the first direction and the protrusions extending in the second direction face each other and do not intersect with each other.

EXAMPLE

As shown in FIG. 4B, ribs having a width (d1) of 4 μm and a height (h) of 2 μm were formed in a grid pattern with an acrylic photosensitive resin composition on the surface of the conductor layer formed of ITO. Here, a plurality of samples having different distances (d2) between the ribs were prepared. Specifically, samples with rib distances (d2) of 100 μm, 150 μm, 200 μm, 250 μm, and 300 μm were prepared. Then, for each sample, as shown in FIG. 4A, a Mg—Ag film was formed on the surface of the conductor layer and the rib by co-evaporation to obtain a test sample.

A comparative sample was also prepared in the same manner as above except that no rib was formed.

The obtained test sample and comparative sample were subjected to a reliability test (conditions: temperature 80° C., humidity 60%, 500 hours). After the reliability test, for each sample, it was visually observed whether peeling between the conductor (ITO) layer-alloy (Mg—Ag) film had occurred. The observation results are summarized in Table 1.

TABLE 1

|  | Distance Between Ribs | Interlayer Peeling |
| --- | --- | --- |
| Example 1 | 100 μm | Peeling not observed |
| Example 2 | 150 μm | Peeling not observed |
| Example 3 | 200 μm | Peeling not observed |
| Example 4 | 250 μm | Observed partial small peeling |
| Example 5 | 300 μm | Observed partial peeling |
| Comparative Example 1 | No Ribs | Observed entire peeling |

The present invention is not limited to the above embodiment, and various modifications can be made. For example, a replacement can be made with a configuration that is substantially the same as the configuration shown in the above-described embodiment, a configuration that exhibits the same operational effect, or a configuration that can achieve the same object.

Within the scope of the idea of the present invention, those skilled in the art can come up with various changes and modifications and it will be understood that these changes and modifications also fall into the scope of the present invention. For example, in each of the above-described embodiments, addition, deletion or redesign of a component, or addition, omission or condition change of a process, which are appropriately made by a person skilled in the art, are also included within the scope of the present invention as long as they remain the gist of the present invention.

What is claimed is:

1. A display device comprising:
   a base material including a display region having a plurality pixels and a frame region adjacent to the display region;
   a lower electrode provided in each of the plurality of pixels;
   are organic material layer arranged on the lower electrode;
   an upper electrode arranged on the organic material layer and covering the display region;
   a conductive layer provided in the frame region and connected to the upper electrode; and
   a rib provided on the conductive layer, wherein
   a part of the upper electrode is arranged above the conductive layer via the rib,
   a first contact portion where the upper electrode and the conductive layer contact each other is located in the frame region, and
   a part of the rib does not overlap the upper electrode in a plan view.

2. The display device according to claim 1, wherein
   the rib includes a first rib and a second rib, the first contact portion being located between the display region and the first rib, the first rib being located between the first contact portion and the second rib,
   the upper electrode crosses over the first rib and is in contact with the second rib, and a second contact portion where the upper electrode and the conductive layer contact each other is located between the first rib and the second rib.

3. The display device according to claim 2, wherein a part of the second rib does not overlap the upper electrode in the plan view.

4. The display device according to claim 1, wherein the rib covers an end portion of the conductive layer.

5. The display device according to claim 1, wherein the first contact portion is surrounded by the rib.

6. The display device according to claim 1, wherein the rib has a grid pattern in the plan view.

7. The display device according to claim 1, wherein a material of the conductive layer is different from a material of the upper electrode.

8. The display device according to claim 1, wherein adhesiveness of the rib to the upper electrode is higher than adhesiveness of the conductive layer to the upper electrode.

9. The display device according to claim 1, wherein the conductive layer is formed in a same layer as the lower electrode.

10. The display device according to claim 1, wherein the conductive layer includes a same material as a material of the lower electrode.

11. The display device according to claim 1, wherein the conductive layer includes an In-based oxide material.

12. The display device according to claim 1, wherein the upper electrode includes a metal material.

13. The display device according to claim 1, wherein the width of the first contact portion is 250 μm or less.

14. The display device according to claim 1, wherein the width of the first contact portion is 100 μm or more.

15. The display device according to claim 1, wherein a first contact area where the conductive layer is in contact with the upper electrode is 80% or more of a sum of the first contact area and a second contact area where the conductive layer is in contact with the rib.

16. A display device comprising:
a base material including a display region having a plurality of pixels and a frame region adjacent to the display region;
a lower electrode provided in each of the plurality of pixels;
an organic material layer arranged on the lower electrode;
an upper electrode arranged on the organic material layer and covering the display region;
a conductive layer provided in the frame region and connected to the upper electrode; and
a rib provided on the conductive layer, wherein
a part of the upper electrode is arranged above the conductive layer via the rib,
the rib includes a plurality of protrusions,
the conductive layer has a plurality of regions located between the plurality of protrusions,
in at least one of the plurality of regions, the conductive layer is in contact with the upper electrode, and
the upper electrode is located across the plurality of protrusions and the plurality of regions.

17. The display device according to claim 16, wherein
the rib includes a first protrusion that runs in a first direction and a second protrusion that runs in a second direction, and
the first protrusion and the second protrusion face each other and do not intersect each other.

18. A display device comprising:
a base material including a display region having a plurality of pixels and a frame region adjacent to the display region;
a lower electrode provided in each of the plurality of pixels;
are organic material layer arranged on the lower electrode;
an upper electrode arranged on the organic material layer and covering the display region;
a conductive layer provided in the frame region and connected to the upper electrode; and
a rib provided on the conductive layer, wherein
a part of the upper electrode is arranged above the conductive layer via the rib,
a first contact portion where the upper electrode and the conductive layer contact each other is located in the frame region,
the rib has a first surface facing the base material and a second surface opposing the first surface, and
an end portion of the upper electrode faces the second surface.

* * * * *